United States Patent [19]

Im

[11] Patent Number: 5,751,732
[45] Date of Patent: May 12, 1998

[54] POLYNOMIAL EVALUATOR FOR USE IN A REED-SOLOMON DECODER

[75] Inventor: Yong-Hee Im, Seoul, Rep. of Korea

[73] Assignee: Daewoo Electronics Co., Ltd., Rep. of Korea

[21] Appl. No.: 755,581

[22] Filed: Nov. 25, 1996

[30] Foreign Application Priority Data

Feb. 28, 1996 [KR]  Rep. of Korea ............... 95-5129
Feb. 29, 1996 [KR]  Rep. of Korea ............... 96-5443
May 9, 1996 [KR]  Rep. of Korea ............... 96-15268

[51] Int. Cl.$^6$ ................................................. H03H 13/00
[52] U.S. Cl. ................................................. 371/37.11
[58] Field of Search ....................................... 371/37.11

[56] References Cited

U.S. PATENT DOCUMENTS

| | | | |
|---|---|---|---|
| 4,162,480 | 7/1979 | Berlekamp | 340/146.1 AL |
| 4,649,541 | 3/1987 | Lahmeyer | 371/37 |
| 4,833,678 | 5/1989 | Cohen | 371/37 |
| 4,875,211 | 10/1989 | Murai et al. | 371/40.1 |
| 5,689,727 | 11/1997 | Bonke et al. | 395/840 |

OTHER PUBLICATIONS

G.C. Clark, Jr. and J. Bibb Cain, "Error–Correction Coding for Digital Communications" 1981, Plenum Press pp. 188–pp. 195.

*Primary Examiner*—Stephen M. Baker
*Attorney, Agent, or Firm*—Pennie & Edmonds LLP

[57] ABSTRACT

A polynomial evaluator, for use in a Reed-Solomon decoder, evaluates a polynomial P(X) iteratively, by substituting $\alpha^{-j}$ for X in a jth iteration, to thereby provide a jth evaluation result $P(\alpha^{-j})$, wherein j is an integer ranging from 0 to N-1, N being a predetermined positive integer, $\alpha$ is a primitive element in a finite field $GF(2^m)$, the evaluator comprising: a memory block having T registers, T being a predefined positive integer; a root input block for sequentially providing a group of T elements in the finite field $GF(2^m)$; a multiplier on the finite field $GF(2^m)$ for sequentially multiplying the contents of each register with each element of the group provided from the root input block, to thereby provide T evaluating terms, wherein the contents of ith register is multiplied with ith element, to thereby provide ith evaluating term, i being 1 to T; a multiplexor for providing 1st to Tth coefficients of the polynomial P(X) or the T evaluating terms, to the memory block; and an addition block for determining a sum of the T evaluating terms.

10 Claims, 5 Drawing Sheets

POLYNOMIAL EVALUATOR FOR USE IN A REED-SOLOMON DECODER

FIELD OF THE INVENTION

The present invention relates to an apparatus for correcting errors present in stored or transmitted data; and, more particularly, to an apparatus for evaluating an error evaluator polynomial, an error locator polynomial and a differential polynomial which are used in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial $i(X)$ with a code generating polynomial $g(X)$ or dividing $i(X)$ by $g(X)$, to thereby provide a codeword polynomial $c(X)$. The code generating polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) codes, which include the Reed-Solomon ("RS") code. The mathematical basis of the RS code is explained in, e.g., the aforementioned reference by Lin et al. and also in Berlekamp, "Algebraic Coding Theory", McGraw-Hill, 1968, which is further referred to in U.S. Pat. No. 4,162,480 issued to Berlekamp.

If roots of the code generating polynomial $g(X)$ of the RS code are 2T consecutive powers of $\alpha$ as in Eq. (1), T being a predetermined positive integer, as many as T errors can be corrected:

$$g(X) = \prod_{i=1}^{2T} (X - \alpha^i) \quad \text{Eq. (1)}$$

wherein $\alpha$ is a primitive element in a finite field $GF(2^m)$.

In the process of receiving or retrieving a transmitted or stored codeword, certain attendant noises may have been converted to an error pattern in the codeword. In order to deal with the error pattern imposed upon the RS code, a four step procedure is generally utilized. In discussing the error-correcting procedure, reference shall be made to a RS code consisting of codewords containing N M-bit symbols, N and M being positive integers (of which K symbols are informational symbols and (N-K) symbols are check symbols, K being a positive integer smaller than N). In that case, $c(X)$ becomes an (N-1)st order polynomial and 2T equals (N-K). As a first error correcting step, syndromes $S_0, S_1, \ldots, S_{2T-1}$ are calculated from a received codeword polynomial $r(X)$, i.e., an (N-1)st order polynomial representing the received codeword.

The received codeword polynomial $r(X)$ is represented as $r_{N-1}X^{N-1} + r_{N-2}X^{N-2} + \ldots + r_1 X^1 + r_0$, wherein $r_j$ is an (N-j)th received symbol of a codeword. As a second step, using the syndromes, coefficients of an error locator polynomial $\sigma(X)$ are calculated. In a third step, the error locator polynomial $\sigma(X)$ is solved to obtain its roots, which represent the error locations in the received codewords. Specifically, if substituting a power of the primitive element, $\alpha^{-j}$, for a variable X in the error locator polynomial $\sigma(X)$ results in 0 (i.e., $\alpha^{-j}$ becomes a root of $\sigma(X)$), it means that an error has occurred in $r_j$, i.e., (N-j)th symbol of a codeword. As a fourth step, error values are calculated by using the error locations and the syndromes. Mathematical expressions for the syndromes and the coefficients of the error locator polynomial are set forth in the afore-referenced U.S. Pat. No. 4,162,480 issued to Berlekamp.

The fourth step will be now explained in more detail.

First, an error evaluator polynomial $\Omega(X)$ may be obtained as follows:

$$\Omega(X) = \sigma(X)S(X) \quad \text{Eq. (2)}$$

wherein $S(X)$ is a syndrome polynomial whose coefficients are the syndromes.

After deriving the error evaluation polynomial $\Omega(X)$, an error value $e_j$ may be calculated as $$e_j = \alpha^j \frac{\Omega(\alpha^{-j})}{\sigma'(\alpha^{-j})} \quad \text{Eq. (3)}$$

wherein $\sigma'(X)$ is the first derivative of the error locator polynomial $\sigma(X)$; $\alpha^{-j}$ is the root of the error locator polynomial obtained in the third step; and the error value $e_j$ corresponds to the (N-j)th symbol which is an error location obtained in the third step.

After finding the error values, the original codeword can be recovered by adding the error values to the corresponding symbols.

As explained above, polynomial evaluation is used in various stages of error correcting procedures, wherein the polynomial evaluation for $\alpha^{-j}$ refers to substitution of the finite field element $\alpha^{-j}$ for a variable X in a given polynomial $p(X)$. First, the error locator polynomial $\sigma(X)$ is evaluated in the third step to find error locations. In the fourth step, the error evaluator polynomial $\Omega(X)$ and the differential polynomial $\sigma'(X)$ are evaluated to determine error values.

The error evaluator polynomial $\Omega(X)$ may be represented as $$\Omega(X) = \sum_{i=0}^{T} \Omega_i \cdot X^i \quad \text{Eq. (4)}$$

Accordingly, evaluating $\Omega(X)$ for $X = \alpha^{-j}$ gives $$\Omega(\alpha^{-j}) = \sum_{i=0}^{T} \Omega_i \cdot (\alpha^{-j})^i \quad \text{Eq. (5A)}$$

$$= \sum_{i=0}^{T} \Omega_i \cdot (\alpha^{-i})^j \quad \text{Eq. (5B)}$$

wherein j is an integer ranging from 0 to N-1, and multiplications and additions are done on the finite field $GF(2^m)$. Evaluation results for other polynomials may be represented in a similar manner.

Referring to FIG. 1, there is shown an exemplary block diagram of a conventional polynomial evaluator 10 which evaluates the error evaluator polynomial $\Omega(X)$ by implementing Eq. (5B) in case of T=8. The evaluator 10 includes 8 evaluation cells (10-1 to 10-8) each of which determines each term of Eq. (5B), i.e. $\Omega_i \alpha^{-ij}$ (which is referred to as an

3

"evaluating term" hereinafter), for i=1 to 8, respectively, an addition block 16 for summing the evaluating terms and a memory 18 for storing $\Omega_0$, i.e., a 0th order coefficient or constant term of the error evaluator polynomial. The evaluator shown in FIG. 1 provides each evaluation result $\Omega(\alpha^{-j})$ per one clock cycle, in the order of j=0 to N−1.

The ith evaluating cell 10-i includes a D flip-flop 11-i for storing the evaluating term, a multiplier 12-i operating on the finite field GF($2^m$) and a memory block 13-i for storing $\alpha^{-i}$, wherein a system clock is fed to the D flip-flop. At the polynomial evaluator 10, the calculation of Eq. (5B) is done iteratively from j=0 to N−1. From now on a kth iteration refers to an iteration for j=k, k being 0 to N−1.

At the start of the evaluation procedure, each of the D flip-flops is initialized with a corresponding coefficient of the error evaluator polynomial. That is, the D flip-flop 11-i included in the ith evaluating cell is initialized with $\Omega_i$.

During a 0th iteration of the evaluation procedure for evaluating $\Omega(\alpha^0)$, the coefficient $\Omega_i$ is fed through the multiplier 13-i to the addition block 16, wherein $\Omega_i$'s for i=0 to T (or a 0th set of the evaluating terms for j=0) are summed to provide a 0th evaluation result $\Omega(\alpha^0)$. To do this, 1 is provided from the memory block 13-i to the multiplier 12-i, to be multiplied to $\Omega_i$ therein, and $\Omega_0$ is provided from the memory 18.

During a first iteration of the evaluation procedure for evaluating $\Omega(\alpha^{-1})$, the coefficient $\Omega_i$ stored in the D flip-flop 11-i is fed to the multiplier 13-i, wherein it is multiplied with $\alpha^{-i}$. Thereafter, $\Omega_i\alpha^{-i}$ is fed to the addition block 16, wherein a first set of evaluating terms for j=1, i.e., $\Omega_i\alpha^{-i}$'s, i being 0 to 8, are summed to provide a 1st evaluation result $\Omega(\alpha^{-1})$. Meanwhile, $\Omega_i\alpha^{-i}$, i being 1 to 8, is fed back to the D flip-flop 11-i and stored therein for a second iteration at the rising edge of the 3rd clock cycle.

During the second iteration of the evaluation procedure for evaluating $\Omega(\alpha^{-2})$, a similar procedure to that of the first iteration is done. The difference is that $\Omega_i\alpha^{-i}$ is fed from the D flip-flop 11-i. Therefore, the multiplier 12-i provides $\Omega_i\alpha^{-2i}$ to the addition block 16, wherein a second set of evaluating terms for j=2, i.e., $\Omega_i\alpha^{-2i}$'s being 0 to T, are summed to provide a second evaluation result $\Omega(\alpha^{-2})$. Note that the 0th evaluating term of each set, i.e., $\Omega_0$, always comes from the memory 18.

By repeating the above procedure, the jth evaluation result $\Omega(\alpha^{-j})$ for j=0 to N−1 is obtained by N iterations.

In accordance with the conventional polynomial evaluator explained above, as many as T evaluating cells are needed to evaluate a polynomial of an order T. Accordingly, as many as T multipliers on the finite field GF($2^m$) are needed. Moreover, the addition block is capable of adding as many as T+1 terms at a time. These facts render the structure of the polynomial evaluator highly complicated and, which may, in turn, makes it rather difficult to implement it by using a VLSI (Very Large Scale Integrating) technology.

SUMMARY OF THE INVENTION

It is, therefore, a primary object of the present invention to provide a polynomial evaluator which is constructed with a reduced number of multipliers on the finite field GF($2^m$), thereby reducing the manufacturing cost and complexity of the device.

It is another object of the present invention to provide a polynomial evaluator which is constructed with a less complicated addition block, thereby achieving a further reduction in the complexity thereof.

In accordance with the present invention, there is provided an apparatus, for use in a RS decoder, which evaluates a polynomial P(X) iteratively, by substituting $\alpha^{-j}$ for X in a jth iteration, to thereby provide a jth evaluation result P($\alpha^{-j}$), wherein j is an integer ranging from 0 to N−1, N being a predetermined positive integer, and $\alpha$ is a primitive element in a finite field GF($2^m$), said apparatus comprising:

a memory block having T registers, T being a predefined positive integer;

a root input block for sequentially providing a group of T elements in the finite field GF($2^m$);

a multiplier on the finite field GF($2^m$) for sequentially multiplying the contents of each register with each element of the group provided from the root input block, to thereby provide T evaluating terms, wherein the contents of an ith register are multiplied with an ith element, to thereby provide an ith evaluating term, i being 1 to T;

a multiplexor for providing 1st to Tth coefficients of the polynomial P(X) or the T evaluating terms, to the memory block; and an addition block for determining a sum of the T evaluating terms.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 2:
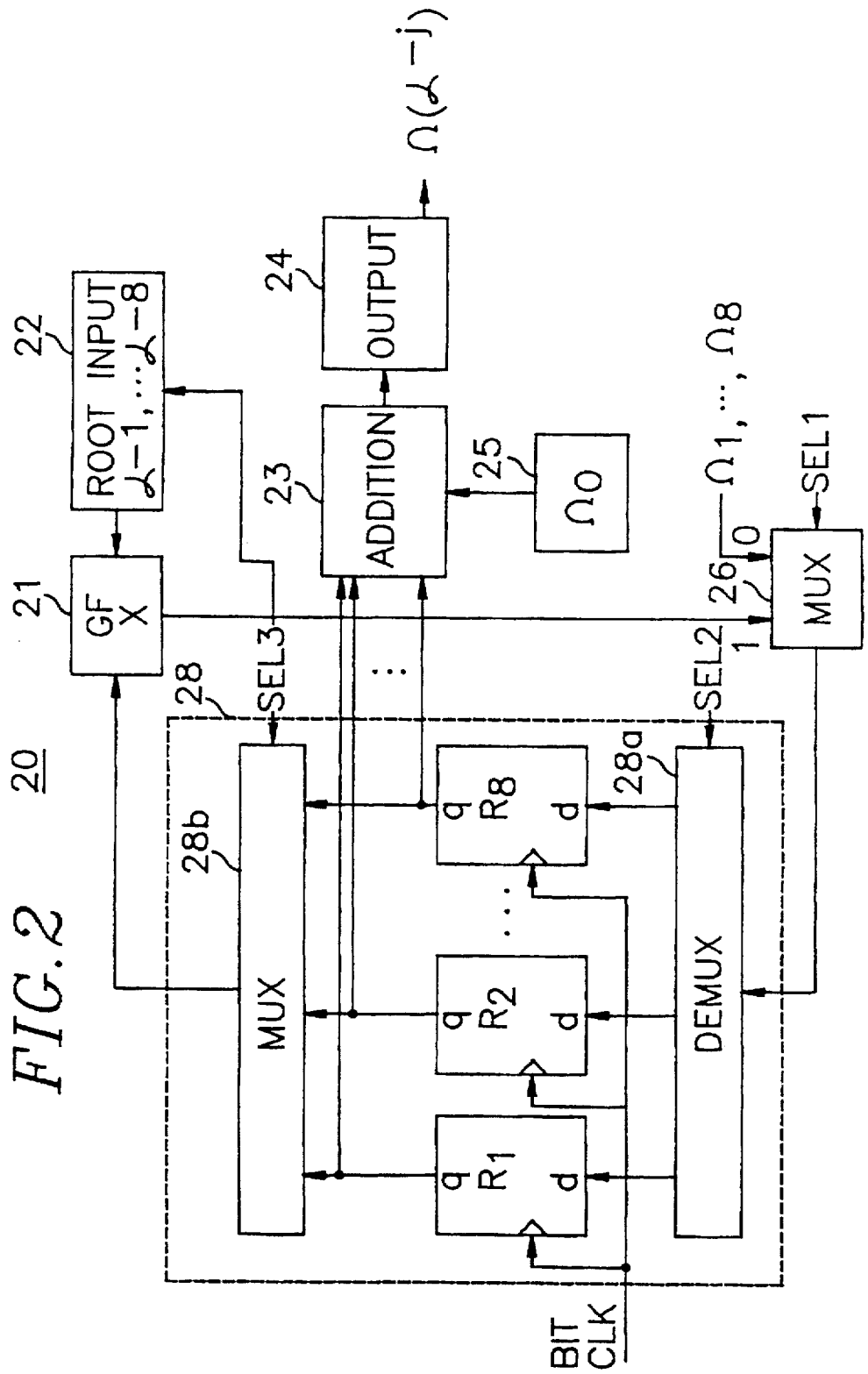
FIG. 2 illustrates a block diagram of a first embodiment of the polynomial evaluator for evaluating an error evaluator polynomial in accordance with the present invention.

Referring to FIG. 2, there is provided a block diagram of a first embodiment of the polynomial evaluator in accordance with the present invention, which evaluates the error evaluator polynomial Q(X) according to $$\Omega(\alpha^{-j}) = \sum_{i=0}^{T} \Omega_i \cdot (\alpha^{-j})^i \quad \text{Eq. (5B)}$$

for j=0 to N−1, wherein T is set to 8 for the purpose of illustration, N being a positive integer. Unlike the conventional one, the polynomial evaluator 20 shown in FIG. 2 includes only one multiplier on the finite field GF($2^m$).

It should also be noted that an auxiliary clock (e.g., a bit clock) is used instead of a system clock, wherein the bit clock refers to a clock signal which is T times faster than the system clock.

Figure 1:
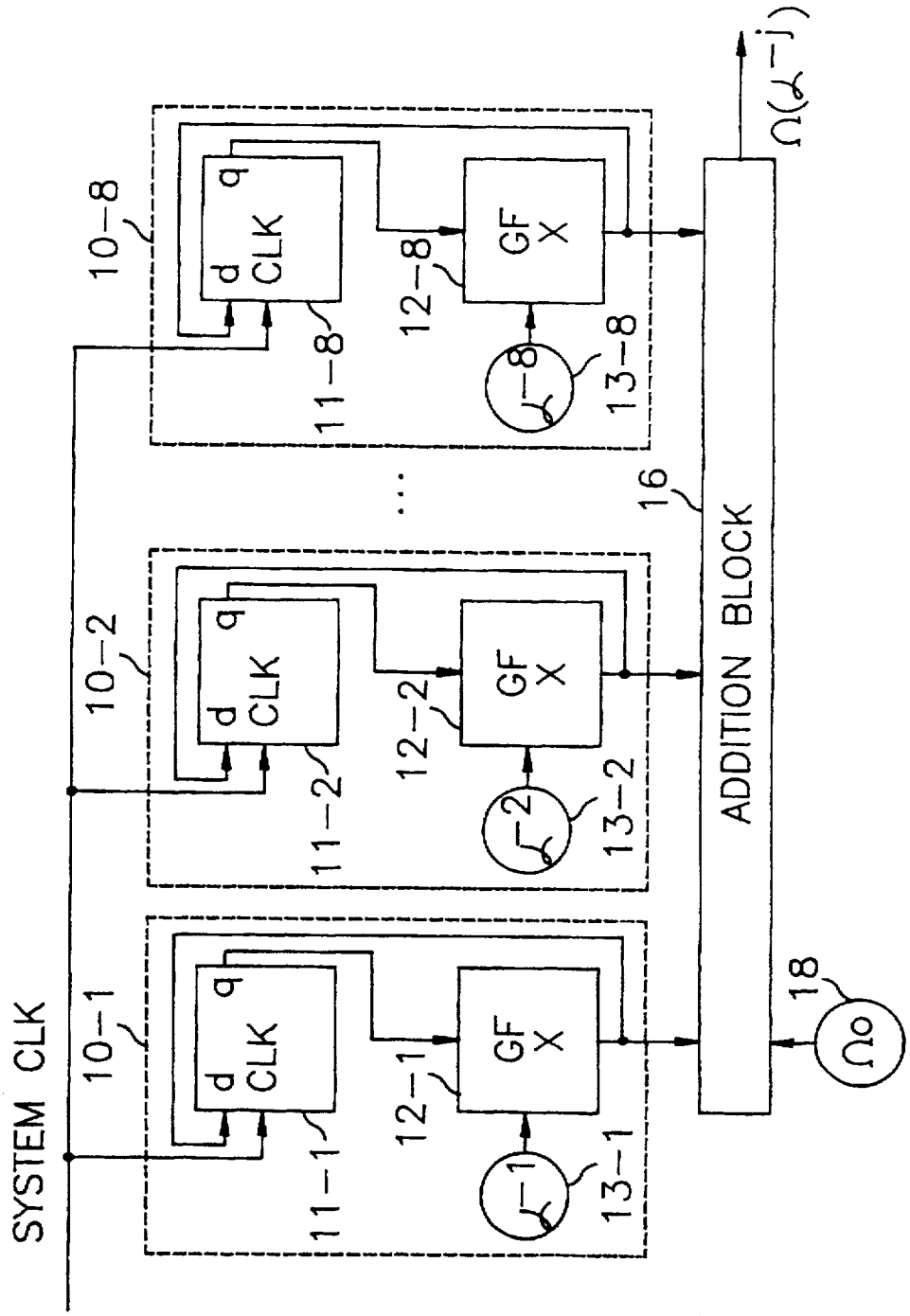
FIG. 1 shows a block diagram of a conventional polynomial evaluator.

The polynomial evaluator 20 shown in FIG. 2 includes an addition block 23 and a memory 25 which directly corresponds to the addition block 16 and the memory 18 shown in FIG. 1, respectively. It also includes a multiplier 21 operating on the finite field GF($2^m$) corresponding to the T multipliers (12-1 to T) shown in FIG. 1; a root input block 22 corresponding to the T memory blocks (13-1 to T) shown in FIG. 1; and a register block 28 which corresponds to the T D flip-flops (11-1 to T). The evaluator 20 further includes a multiplexor ("MUX") 26 and an output block 24. Although the functions of the corresponding blocks may be similar, the detailed operations thereof are different. Specifically, the multiplier 21 shown in FIG. 2 performs multiplication once per one bit clock cycle, i.e., it does T times as many jobs as that of each multiplier shown in FIG. 1 so that the multiplier 21 can substitute T multipliers included in the conventional evaluator. To support this, the register block 28 is constructed to include 8 registers ($R_1$ to $R_8$) connected in parallel, and a multiplexor ("MUX") 28b and a demultiplexor ("DEMUX") 28a for controlling the input and output of the registers. Edge triggered D flip-flops may be used as the registers.

At the polynomial evaluator 20, like the conventional evaluator shown in FIG. 1, the calculation of Eq. (5B) is done iteratively from j=0 to N−1. An iteration may be preferably done in one system clock cycle.

During a 0th or initial iteration of the evaluation procedure for evaluating $\Omega(\alpha^0)$, each of the coefficients of the error evaluator polynomial ($\Omega_1$ to $\Omega_8$) is sequentially fed through the MUX 26 and the DEMUX 28a to each register ($R_1$ to $R_8$) for one bit clock cycle. To do this, a selection signal SEL1 controls the MUX 26 to provide $\Omega_i$ of an input port 0 for the 0th iteration. The DEMUX 28a distributes each of the coefficients ($\Omega_i$) to the corresponding register ($R_i$) in response to a second selection signal SEL2. To do this, SEL2 designates one of the 8 registers for each bit clock cycle. After $\Omega_i$'s, i being 1 to 8, are all stored at the corresponding registers, the contents of the D flip-flops and $\Omega_0$ provided from the memory 25 are summed at the addition block 23, to thereby provide the 0th evaluation result $\Omega(\alpha^0)$ to the output block 24 and complete the 0th iteration. The output block 24 stores the 0th evaluation result $\Omega(\alpha^0)$ to be used in subsequent error correcting procedures.

During a 1st iteration of the evaluation procedure for evaluating $\Omega(\alpha^{-1})$, each of the coefficients of the error evaluator polynomial ($\Omega_1$ to $\Omega_8$) stored at the registers is sequentially fed through the MUX 28b to the multiplier 21 one per one bit clock cycle. At the multiplier 21, $\Omega_1$ is multiplied with $\alpha^{-1}$ during a bit clock cycle and $\Omega_2$ with $\alpha^{-2}$ during a next bit clock cycle, and so on. To do this, a selection signal SEL3 controls the MUX 28b and the root input block 22 to provide $\Omega_i$ and $\alpha^{-1}$, respectively, in a timely manner. The output of the multiplier 21, i.e., $\Omega_i \alpha^{-i}$'s (ith evaluating term of the 1st iteration) are sequentially fed through the MUX 26 and the DEMUX 28a to each corresponding register ($R_1$ to $R_8$) one per one bit clock cycle. To do this, a selection signal SEL1 controls the MUX 26 to select the output of the multiplier 21 on an input port 1 for all the iterations except the 0th iteration. SEL2 controls the DEMUX 28a to provide $\Omega_i \alpha^{-i}$ to a corresponding register $R_i$. After $\Omega_i \alpha^{-i}$'s, i being 1 to 8, are all stored at the corresponding registers, the contents of the registers and $\Omega_0$ provided from the memory 25 are summed at the addition block 23, to provide the 1st evaluation result $\Omega(\alpha^{-1})$ to the output block 24.

By repeating the above procedure, the evaluation result $\Omega(\alpha^{-j})$'s for j=0 to N−1 are obtained in N iterations.

Figure 3:
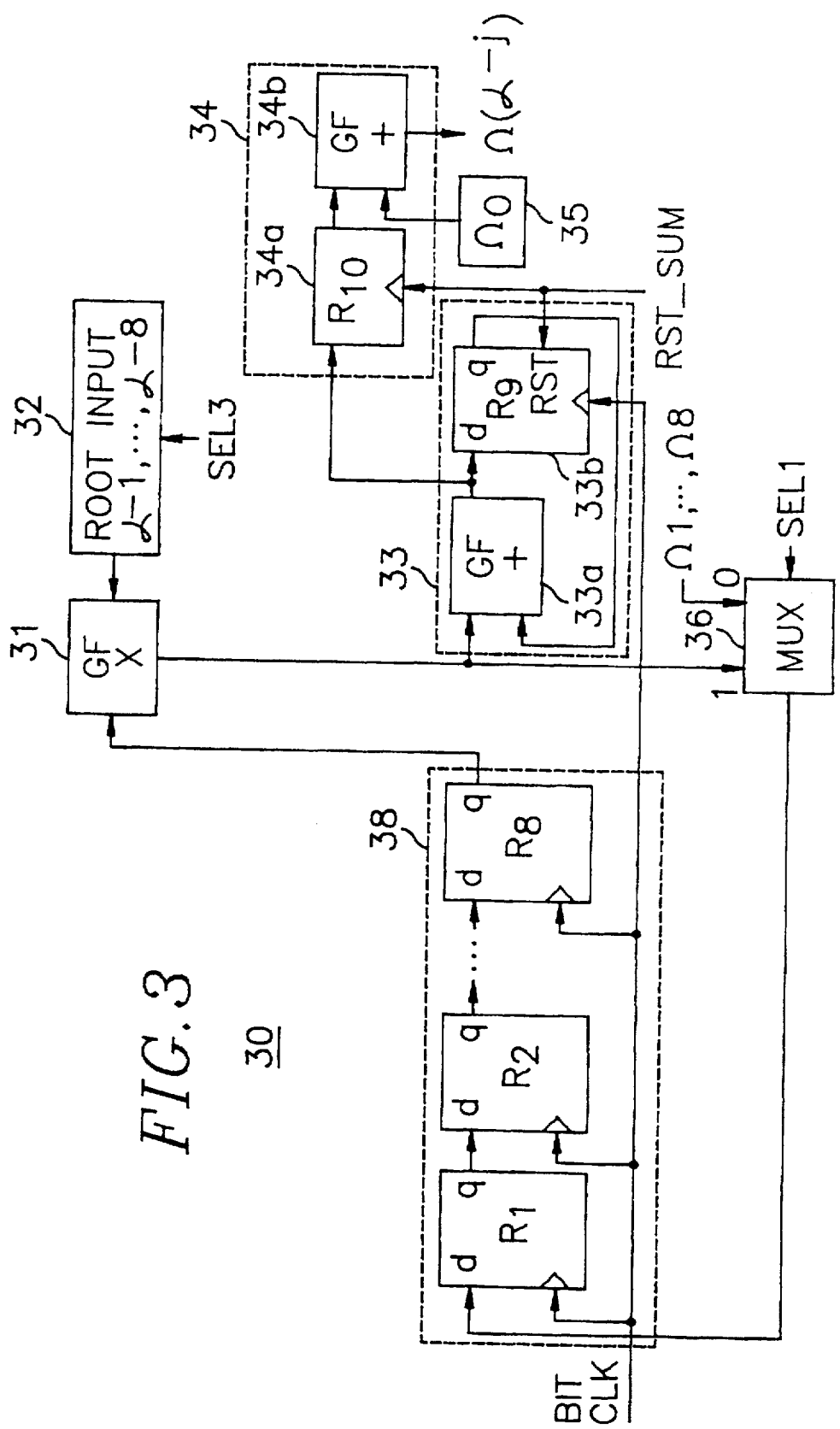
FIG. 3 offers a block diagram of a second embodiment of the polynomial evaluator for evaluating an error evaluator polynomial in accordance with the present invention.

Referring to FIG. 3, there is provided a block diagram of a second embodiment of the polynomial evaluator in accordance with the present invention, which performs essentially the same task as that of the first embodiment shown in FIG. 2.

The polynomial evaluator 30 shown in FIG. 3 includes a multiplier 31 operating on the finite field $GF(2^m)$, a root input block 32, a memory 35, a multiplexor 36 and a register block 38 which directly corresponds to those of the first embodiment shown in FIG. 2, respectively. It also includes an addition block 33 and an output block 34 whose overall function is somewhat similar to those shown in FIG. 2 but the detailed operation thereof is different.

The evaluator 30 shown in FIG. 3 will be explained mainly by describing the difference from the evaluator 20 shown in FIG. 2.

First, while the register block 28 shown in FIG. 2 includes the 8 registers, the MUX 28b and the DEMUX 28a, wherein the 8 registers are connected in parallel to the MUX 28b and the DEMUX 28a, the register block 38 includes only 8 registers which are connected serially. In the first embodiment shown in FIG. 2, each of the evaluating terms, i.e., $\Omega_i \alpha^{-ij}$, is stored at its corresponding register with the help of the MUX 28b and the DEMUX 28a included in the register block 28. However, in the second embodiment, each of the evaluating terms is first fed to $R_1$ and stored therein for a bit clock cycle. The content of $R_1$ is shifted to $R_2$ and stored therein for a next bit clock cycle, and then to $R_3$, and so on. Finally, the output of $R_8$ is fed to the multiplier 31. As a result, the overall function of the register block 38, i.e., storing the evaluating terms for one iteration, is the same as that of the first embodiment shown in FIG. 2. The difference is that while in the first embodiment each evaluating term is stored through the DEMUX 28a in one corresponding register before it is fed through the MUX 28b to the multiplier 21, in the second embodiment it is stored in each of the registers sequentially for a bit clock cycle before it is fed to the multiplier 31.

A second difference lies in the operation of the addition block 33. While the addition operations of Eq. (5B) are done at a time in the first embodiment, it is done in a sequential manner in the addition block 33 of the second embodiment. Specifically, evaluating terms are sequentially provided to the addition block 33 from the multiplier 31 one per one bit clock cycle. The addition block 33 includes a two input adder 33a and a register 33b, wherein the adder 33a operating on the finite field $GF(2^m)$ sequentially adds each of the evaluating terms provided from the multiplier 31 to the contents of the register 33b and the register 33b stores a 1st to 7th partial sum of the evaluating terms provided from the adder 33a and feeds the partial sum to the adder 33a, the Lth partial sum referring to sums of L evaluating terms, L being 1 to 7, in the course of sequential addition of Eq. (5B). The addition block 33 finally provides an 8th partial sum, i.e., a sum of the 8 evaluating terms $(\Omega_1 \alpha^{-j} + \Omega_2 \alpha^{-2j} + \ldots + \Omega_8 \alpha^{-8j})$ to the output block 24. It should be noted that while the addition block of the first embodiment is constructed to add 9 terms at a time, the addition block of the second embodiment adds only 2 terms at a time, to thereby render the structure thereof less complex than those of the evaluator 10 or 20.

A third difference lies in the structure and function of the output block 34. The output block 34 includes a register 34a for storing the 8th partial sum provided from the addition block 33 and an adder 34b operating on the finite field $GF(2^m)$ for adding the 0th coefficient $\Omega_0$ to the partial sum, to thereby provide the evaluation result $\Omega(\alpha^{-j})$.

The detailed operation of the evaluator 30 will now be described. As in the first embodiment, at the polynomial evaluator 30, the calculation of Eq. (5B) is done iteratively from j=0 to N−1.

Before starting the 0th iteration of the evaluation procedure for determining $\Omega(\alpha^0)$, the registers included in the register block 38 are initialized with $\Omega_i$. To do this, each of the coefficients of the error evaluator polynomial ($\Omega_1$ to $\Omega_8$) is sequentially fed through MUX 36 to the register block 38 one for one bit clock cycle. A selection signal SEL1 controls MUX 36 to select $\Omega_i$ on an input port 0 for the initialization. As explained above, $\Omega_i$'s, i being 1 to 8, are shifted through the registers before they are fed to the multiplier 31.

After each of the registers is filled with a corresponding $\Omega_i$ (e.g., $\Omega_1$ in $R_8$, $\Omega_2$ in $R_7$, and so on), the 0th iteration for determining $\Omega(\alpha^0)$ begins.

During the first bit clock of the 0th iteration, the multiplier 31 multiplies 1 with $\Omega_1$ provided thereto from $R_8$. To do this, 1 is fed from the root input block 32 to the multiplier 31. (It should be noted that, during the 2nd to Nth iterations, $\alpha^{-i}$'s, i being 1 to 8, are fed to the multiplier 31, to be multiplied to the corresponding evaluating terms provided from the register block 38.) The output of the multiplier 31, i.e., $\Omega_1$ (or in other words, 1st evaluating term of the 0th set, the 0th set of evaluating terms referring to $\Omega_i\alpha^0$'s), is fed to the adder 33a. Upon receiving $\Omega_1$ from the multiplier 31, the adder 33a adds it to the initial content, i.e., 0, of the register 33b. Then the 1st partial sum, $\Omega_1$, is fed back to the register 33b, to be stored therein, e.g., at the rising edge of the next bit clock. $\Omega_1$ provided from the multiplier 31 is also fed to the register block 38, to thereby shift the contents of each register to right, e.g., on the rising edge of the second bit clock of the first iteration. The contents of the registers, during the second bit clock cycle, are given in Table 1.

TABLE 1

| $R_1$ | $R_2$ | $R_3$ | $R_4$ | $R_5$ | $R_6$ | $R_7$ | $R_8$ |
|---|---|---|---|---|---|---|---|
| $\Omega_1$ | $\Omega_8$ | $\Omega_7$ | $\Omega_6$ | $\Omega_5$ | $\Omega_4$ | $\Omega_3$ | $\Omega_2$ |

During the second bit clock of the 0th iteration, the multiplier 31 multiplies 1 with $\Omega_2$ provided thereto from $R_8$. The output of the multiplier 31, i.e., $\Omega_2$ at this time, is fed to the adder 33a, wherein it is added to the contents of the register 33b, i.e., $\Omega_1$. Then the second partial sum, $\Omega_1+\Omega_2$, is fed back to the register 33b, to be stored therein. $\Omega_2$ from the multiplier is fed to the register block 38, to thereby shift contents of each register to right on the rising edge of the next bit clock cycle. Then, the contents of the registers are changed as given in table 2.

TABLE 2

| $R_1$ | $R_2$ | $R_3$ | $R_4$ | $R_5$ | $R_6$ | $R_7$ | $R_8$ |
|---|---|---|---|---|---|---|---|
| $\Omega_2$ | $\Omega_1$ | $\Omega_8$ | $\Omega_7$ | $\Omega_6$ | $\Omega_5$ | $\Omega_4$ | $\Omega_3$ |

By repeating the above procedure for the remaining bit clock cycles of the 0th iteration, $\Omega_1$ to $\Omega_8$ is summed at the addition block 33 and the result, i.e., $\Omega_1+\Omega_2+\ldots+\Omega_8$, is fed to and stored in $R_{10}$ under the control of a signal RST_SUM provided externally and then fed to an adder 34b wherein it is added to $\Omega_0$, to thereby provide the final result of the 0th iteration, i.e., 0th evaluation result $\Omega(\alpha^0)$. RST_SUM is a signal that notifies the time when an evaluation result is provided from the adder 33. RST_SUM may be a signal that goes to "1" at the end of each iteration (equivalently at the start of a next iteration). RST_SUM also serves to initialize the register 33b for a next iteration. (Note that the content of register 33b should be 0 at the start of each iteration.)

The first iteration is similar to the 0th iteration except that $\alpha^{-i}$, instead of 1, is multiplied with an output from the register block 38, $\Omega_i$, one by one at the multiplier 31, to provide a first set of evaluating terms $\Omega_i\alpha^{-i}$'s to the addition block 33 and back to the register block 38. Specifically, $\alpha^{-1}$ is multiplied with $\Omega_1$ during the first bit clock cycle, $\alpha^{-2}$ with $\Omega_2$, and so on. By summing the first set of evaluating terms, $\Omega_i\alpha^{-i}$'s, the first evaluation result $\Omega(\alpha^{-1})$ is obtained at the end of the first iteration. By repeating the above procedure, $\Omega(\alpha^{-j})$'s for j=0 to N-1 are obtained in N iterations.

The contents of the registers $R_1$ to $R_8$ and $R_9$ for each bit clock cycle of the 0th to 2nd iterations are shown in Table 3, wherein each row corresponds to each bit clock cycle.

TABLE 3

| iteration | $R_1$ | $R_2$ | ... | $R_7$ | $R_8$ | $R_9$ |
|---|---|---|---|---|---|---|
| 0th | $\Omega_8$ | $\Omega_7$ |  | $\Omega_2$ | $\Omega_1$ | 0 |
|  | $\Omega_1$ | $\Omega_8$ | ... | $\Omega_3$ | $\Omega_2$ | $\Omega_1$ |
|  | . | . |  | . | . | . |
|  | . | . |  | . | . | . |
|  | . | . |  | . | . | . |
|  | $\Omega_7$ | $\Omega_6$ |  | $\Omega_1$ | $\Omega_8$ | $\Omega_1 + \ldots + \Omega_7$ |
| 1st | $\Omega_8$ | $\Omega_7$ |  | $\Omega_2$ | $\Omega_1$ | 0 |
|  | $\Omega_1\alpha^{-1}$ | $\Omega_8$ |  | $\Omega_3$ | $\Omega_2$ | $\Omega_1\alpha^{-1}$ |
|  | $\Omega_2\alpha^{-2}$ | $\Omega_1\alpha^{-1}$ | ... | $\Omega_4$ | $\Omega_3$ | $\Omega_1\alpha^{-1} + \Omega_2\alpha^{-2}$ |
|  | . | . |  | . | . | . |
|  | . | . |  | . | . | . |
|  | $\Omega_7\alpha^{-7}$ | $\Omega_6\alpha^{-6}$ |  | $\Omega_1\alpha^{-1}$ | $\Omega_8$ | $\Omega_1\alpha^{-1} + \ldots + \Omega_7\alpha^{-7}$ |
| 2nd | $\Omega_8\alpha^{-8}$ | $\Omega_7\alpha^{-7}$ |  | $\Omega_2\alpha^{-2}$ | $\Omega_1\alpha^{-1}$ | 0 |
|  | $\Omega_1\alpha^{-2}$ | $\Omega_8\alpha^{-8}$ |  | $\Omega_3\alpha^{-3}$ | $\Omega_2\alpha^{-2}$ | $\Omega_1\alpha^{-2}$ |
|  | $\Omega_2\alpha^{-4}$ | $\Omega_1\alpha^{-2}$ | ... | $\Omega_4\alpha^{-4}$ | $\Omega_3\alpha^{-3}$ | $\Omega_1\alpha^{-2} + \Omega_2\alpha^{-4}$ |
|  | . | . |  | . | . | . |
|  | . | . |  | . | . | . |
|  | $\Omega_7\alpha^{-14}$ | $\Omega_6\alpha^{-12}$ |  | $\Omega_1\alpha^{-2}$ | $\Omega_8\alpha^{-8}$ | $\Omega_1\alpha^{-2} + \ldots + \Omega_7\alpha^{-14}$ |

Figure 4:
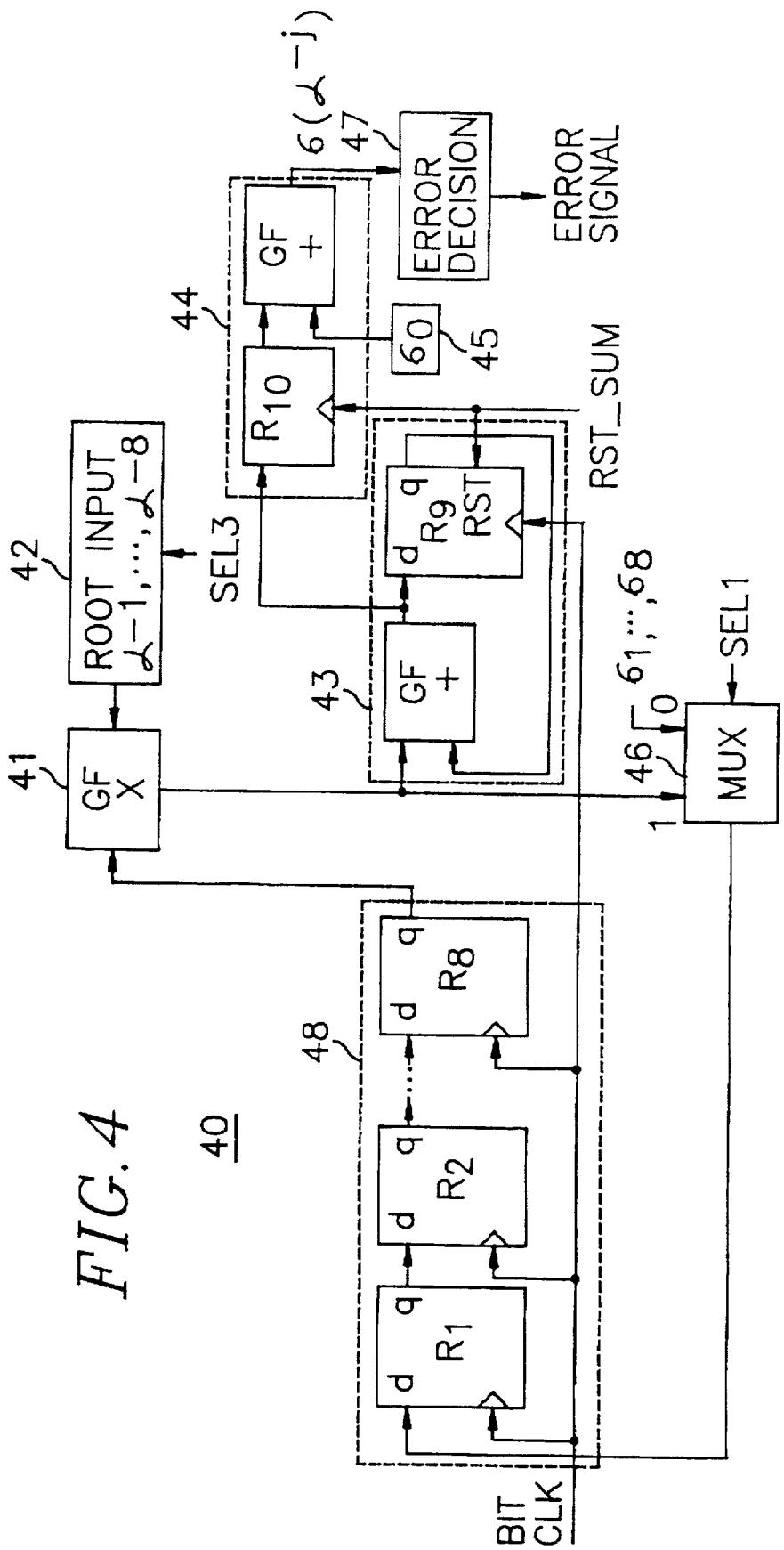
FIG. 4 presents a block diagram of a third embodiment of the polynomial evaluator for evaluating an error locator polynomial in accordance with the present invention.

Referring to FIG. 4, there is provided a block diagram of another embodiment of the polynomial evaluator in accordance with the present invention, which evaluates the error locator polynomial $\sigma(X)$. The structure and function of the evaluator 40 shown in FIG. 4 are essentially identical to those of the evaluator 30 except an additional error decision block 47. As the object of the evaluator 40 is to evaluate the error locator polynomial, the coefficients of the error locator polynomial $\sigma_i$ are fed to MUX 46. By the same procedure explained with reference to FIG. 3, an output block 44 provides the evaluation result $\sigma(\alpha^{-j})$, for each iteration.

At the error decision block 47, in case $\sigma(\alpha^{-j})$ is 0, an error signal, which notifies that an error has occurred at a corresponding symbol of a codeword, is generated.

Figure 5:
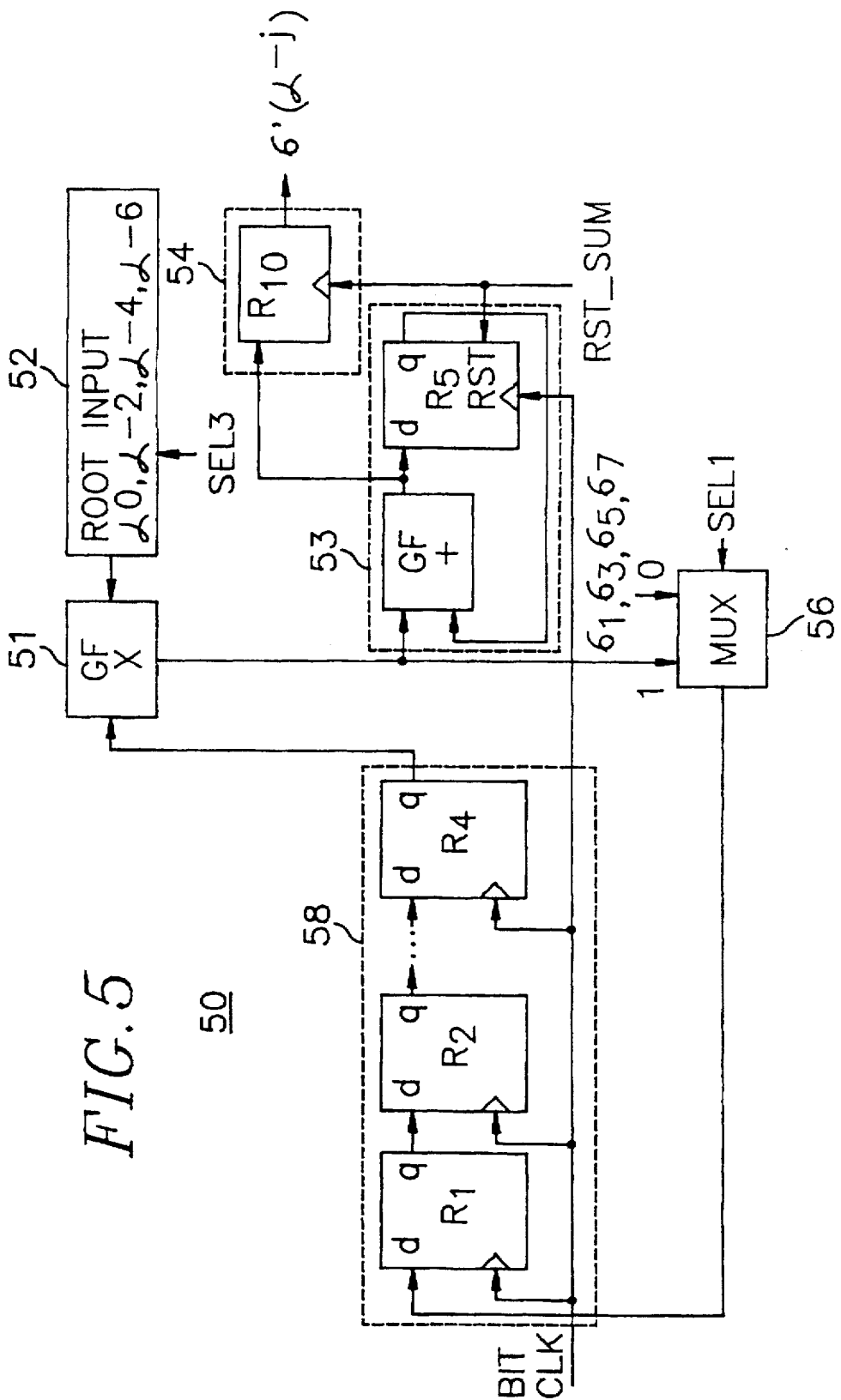
FIG. 5 provides a block diagram of a fourth embodiment of the polynomial evaluator for evaluating a differential polynomial in accordance with the present invention.

Referring to FIG. 5, there is provided a block diagram of a fourth embodiment of the polynomial evaluator in accordance with the present invention, which evaluates the differential polynomial $\sigma'(X)$, i.e., the first derivative of the error locator polynomial $\sigma(X)$.

When the error locator polynomial is an 8th order polynomial represented as $$\sigma(X)=\sigma_0+\sigma_1 x+\sigma_2 x^2+\sigma_3 x^3+\sigma_4 x^4+\sigma_4 x^4+\sigma_5 x^5+\sigma_6 x^6+\sigma_7 x^7+\sigma_8 x^8, \quad (6)$$

the differential polynomial is given as $$\sigma'(X)=\sigma_1+2\sigma_2 x^1+3\sigma_3 x^2+4\sigma_4 x^3+5\sigma_5 x^4+6\sigma_6 x^5+7\sigma_7 x^6+8\sigma_8 x^7. \quad (7A)$$

Since two identical numbers in the finite field yield 0, Eq. (7A) is further simplified as $$\sigma'(X)=\sigma_1+\sigma_3 x^2+\sigma_5 x^4+\sigma_7 x^6 \quad (7B)$$

Accordingly, evaluating $\sigma'(X)$ for $\alpha^{-j}$ gives $$\sigma'(\alpha^{-j}) = \sum_{i=1,(i=\text{odd})}^{T} \sigma_i \cdot (\alpha^{-(i-1)})^j \quad \text{Eq. (7C)}$$

The structure of the evaluator is modified to deal with Eq. (7C), which distinguishes the evaluator 50 from the evaluator 30. Specifically, as the evaluation result of the differential polynomial includes only even powers of $\alpha$, the root input block provides only even powers of $\alpha$, i.e., $\alpha^0$, $\alpha^{-2}$, $\alpha^{-4}$ and $\alpha^{-6}$; the register block 58 includes half as many registers as those of other evaluators shown in FIGS. 2 to 4; only coefficients of odd power terms, e.g., $\sigma_1$, $\sigma_3$ and $\sigma_5$, are provided to MUX 56; and the output block does not include an adder, for the 0th coefficient ($\sigma_0$) is not included in the evaluation result. Except these, overall operation of the evaluator 50 is similar to the evaluator 40 shown in FIG. 4. The contents of the registers $R_1$ to $R_5$ for each bit clock cycle of 0th to second iterations are shown in Table 4, wherein each row may correspond to each bit clock cycle.

Referring now back to FIG. 2, the evaluator 20 may also be modified to perform the same task as the evaluators 40 and 50. Specifically, by adding an error decision block to the evaluator 20 and by providing coefficients of the error locator polynomial $\sigma_i$ instead of $\Omega_i$ to the MUX 26, the evaluator 20 can be modified to perform the same task as that of the evaluator 40. Similarly, by providing even powers of $\alpha$ to the multiplier 21 and providing the coefficients of the odd power terms of the error locator polynomial to the MUX 26, and eliminating the memory 25, the evaluator 20 can be modified to perform the same task as that of the evaluator 50.

TABLE 4

| iteration | $R_1$ | $R_2$ | $R_3$ | $R_4$ | $R_5$ |
|---|---|---|---|---|---|
| 0th | $\Omega_7$ | $\Omega_5$ | $\Omega_3$ | $\Omega_1$ | 0 |
|  | $\Omega_1$ | $\Omega_7$ | $\Omega_5$ | $\Omega_3$ | $\Omega_1$ |
|  | $\Omega_3$ | $\Omega_1$ | $\Omega_7$ | $\Omega_5$ | $\Omega_1 + \Omega_3$ |
|  | $\Omega_5$ | $\Omega_3$ | $\Omega_1$ | $\Omega_7$ | $\Omega_1 + \Omega_3 + \Omega_5$ |

TABLE 4-continued

| iteration | $R_1$ | $R_2$ | $R_3$ | $R_4$ | $R_5$ |
|---|---|---|---|---|---|
| 1st | $\Omega^7$ | $\Omega_5$ | $\Omega_3$ | $\Omega_1$ | 0 |
|  | $\Omega_1\alpha^0$ | $\Omega_7$ | $\Omega_5$ | $\Omega_3$ | $\Omega_1\alpha^0$ |
|  | $\Omega_3\alpha^{-2}$ | $\Omega_1\alpha^0$ | $\Omega_7$ | $\Omega_5$ | $\Omega_1\alpha^0 + \Omega_3\alpha^{-2}$ |
|  | $\Omega_5\alpha^{-4}$ | $\Omega_3\alpha^{-2}$ | $\Omega_1\alpha^0$ | $\Omega_7$ | $\Omega_1\alpha^0 + \Omega_3\alpha^{-2} + \Omega_5\alpha^{-4}$ |
| 2nd | $\Omega^7\alpha^{-6}$ | $\Omega_5\alpha^{-4}$ | $\Omega_3\alpha^{-2}$ | $\Omega_1\alpha^0$ | 0 |
|  | $\Omega_1\alpha^0$ | $\Omega_7\alpha^{-6}$ | $\Omega_5\alpha^{-4}$ | $\Omega_3\alpha^{-2}$ | $\Omega_1\alpha^0$ |
|  | $\Omega_3\alpha^{-4}$ | $\Omega_1\alpha^0$ | $\Omega_7\alpha^{-6}$ | $\Omega_5\alpha^{-4}$ | $\Omega_1\alpha^0 + \Omega_3\alpha^{-4}$ |
|  | $\Omega_5\alpha^{-8}$ | $\Omega_3\alpha^{-4}$ | $\Omega_1\alpha^0$ | $\Omega_7\alpha^{-6}$ | $\Omega_1\alpha^0 + \Omega_3\alpha^{-4} + \Omega_5\alpha^{-8}$ |

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a Reed-Solomon decoder, which evaluates a polynomial P(X) iteratively, by substituting $\alpha^{-j}$ for X in a jth iteration, to thereby provide a jth evaluation result $P(\alpha^{-j})$, wherein j is an integer ranging from 0 to N−1, N being a predetermined positive integer, and $\alpha$ is a primitive element in a finite field $GF(2^m)$, said apparatus comprising:

a memory block having T memory means, T being a predefined positive integer;

input means for sequentially providing a group of T elements in the finite field $GF(2^m)$;

means for sequentially multiplying the contents of each memory means with each element of the group provided from the input means, to thereby provide T evaluating terms, wherein the contents of ith memory means are multiplied with an ith element, to thereby provide an ith evaluating term, i being 1 to T;

selection means for providing 1st to Tth coefficients of the polynomial P(X) or the T evaluating terms, to the memory block; and means for determining a sum of the T evaluating terms.

2. An apparatus, for use in a Reed-Solomon decoder, which evaluates a polynomial P(X) iteratively, by substituting $\alpha^{-j}$ for X in a jth iteration, to thereby provide a jth evaluation result $P(\alpha^{-j})$, wherein j is an integer ranging from 0 to N−1, N being a predetermined positive integer, and $\alpha$ is a primitive element in a finite field $GF(2^m)$, said apparatus comprising:

T memory means, T being a predefined positive integer;

converting means for sequentially providing contents of the T memory means during a (j1)th iteration, j1 being 1 to N−1;

input means for sequentially providing T elements in the finite field $GF(2^m)$ during the (j1)th iteration;

means, during the (j1)th iteration, for sequentially multiplying the contents of each memory means provided from the converting means with each element in the finite field $GF(2^m)$ provided from the input means, to thereby provide a (j1)th set of T evaluating terms, wherein the content of an ith memory means is multiplied with an ith element in the finite field $GF(2^m)$, to thereby provide an ith evaluating term of the (j1)th set, i being 1 to T;

selection means for providing 1st to Tth coefficients of the polynomial P(X) during a 0th iteration, and for providing the (j1)th set of T evaluating terms during the (j1)th iteration, the selection means providing an ith coefficient of the polynomial P(X) or the ith evaluating term of the (j1)th set, to the ith memory means to be stored therein; and means, during the jth iteration, for determining a sum of the contents of the T memory means and adding a 0th coefficient of the polynomial P(X) thereto, to thereby provide the jth evaluation result.

3. The apparatus of claim 2, wherein the polynomial P(X) is an error evaluator polynomial of an order T; and the ith element in the finite field $GF(2^m)$ is $\alpha^{-i}$.

4. The apparatus of claim 2, wherein the polynomial P(X) is an error locator polynomial of an order T; and the ith element in the finite field $GF(2^m)$ is $\alpha^{-i}$, the apparatus further comprising means for deciding whether the evaluation result equals 0, to thereby provide an error signal.

5. An apparatus, for use in a Reed-Solomon decoder, which evaluates a polynomial P(X) iteratively, by substituting $\alpha^{-j}$ for X in a jth iteration, to thereby provide a jth evaluation result $P(\alpha^{-j})$, wherein j is an integer ranging from 0 to N−1, N being a predetermined positive integer, and $\alpha$ is a primitive element in a finite field $GF(2^m)$, said apparatus comprising:

FIFO buffer having T memory means, T being a predefined positive integer;

means for initializing the FIFO buffer with a first group of T coefficients of the polynomial by sequentially providing the first group of T coefficients to the FIFO buffer;

input means for providing 1 during a 0th iteration and for sequentially providing T elements in the finite field during a (j1)th iteration, j1 being 1 to N−1;

means for sequentially multiplying the contents of the FIFO buffer with 1 or the element in the finite field provided from the input means, to thereby provide a jth set of T evaluating terms during the jth iteration;

means for sequentially providing the jth set of T evaluating terms during the jth iteration, to the FIFO buffer, to be stored therein; and addition means for determining a sum of the T evaluating terms of the jth set, to thereby provide a jth sum.

6. The apparatus of claim 5, wherein the addition means including:

an adder for adding an evaluating term provided from the multiplication means with a feedback value, to thereby provide a partial sum or the jth sum; and second memory means for storing the partial sum provided from the adder and providing the partial sum as the feedback value to the adder, the contents of the second memory means being set to 0 at the start of each iteration.

7. The apparatus of claim 5, wherein the polynomial P(X) is an error evaluator polynomial of order T; an ith element in the finite field $GF(2^m)$ is $\alpha^{-i}$; the T coefficients of the first group are 1st to Tth coefficients of the error evaluator polynomial; said apparatus further comprising means, during the jth iteration, for adding a 0th coefficient of the error evaluator polynomial to the jth sum, to thereby provide the jth evaluation result.

8. The apparatus of claim 5, wherein the polynomial P(X) is an error locator polynomial of an order T; an ith element in the finite field $GF(2^m)$ is $\alpha^{-i}$; the T coefficients of the first group are 1st to Tth coefficients of the error locator polynomial, said apparatus further comprising means, during the jth iteration, for adding a 0th coefficient of the error locator polynomial to the jth sum, to thereby provide the jth evaluation result.

9. The apparatus of claim 8 further comprising means for deciding whether the evaluation result equals 0, to thereby providing an error signal.

10. The apparatus of claim 5, wherein the polynomial P(X) is a first derivative of an error locator polynomial represented as $\sigma_1 + \sigma_3 x^2 + \sigma_5 x^4 + \ldots + \sigma_{2T-1} x^{2T-2}$, $\sigma_k$ being a kth coefficient of the error locator polynomial; the T coefficients of the first group are coefficients of odd power terms of the error locator polynomial; and an ith element in the finite field $GF(2^m)$ is $\alpha^{2(i-1)}$.

* * * * *